United States Patent
Daou

(10) Patent No.: US 7,339,984 B1
(45) Date of Patent: Mar. 4, 2008

(54) METHOD AND APPARATUS FOR JITTER MEASUREMENT USING PHASE AND AMPLITUDE UNDERSAMPLING

(75) Inventor: Fadi Daou, Milton, MA (US)

(73) Assignee: Agilent Technologies, Inc., Santa Clara, CA (US)

( * ) Notice: Subject to any disclaimer, the term of this patent is extended or adjusted under 35 U.S.C. 154(b) by 879 days.

(21) Appl. No.: 10/656,929

(22) Filed: Sep. 5, 2003

Related U.S. Application Data

(60) Provisional application No. 60/461,933, filed on Apr. 10, 2003, provisional application No. 60/477,520, filed on Jun. 11, 2003.

(51) Int. Cl.
*H04B 17/00* (2006.01)
(52) U.S. Cl. .................................... 375/225
(58) Field of Classification Search ............... 702/69, 702/66; 327/96; 324/76.77; 375/226
See application file for complete search history.

(56) References Cited

U.S. PATENT DOCUMENTS

| 4,751,468 A | 6/1988 | Agoston |
| 4,812,769 A | 3/1989 | Agoston |
| 5,291,074 A * | 3/1994 | Nayebi .................. 327/96 |
| 5,557,196 A * | 9/1996 | Ujiie .................. 324/76.77 |
| 5,692,009 A | 11/1997 | Iijima |
| 5,748,672 A * | 5/1998 | Smith et al. .......... 375/226 |
| 6,369,659 B1 | 4/2002 | Delzer et al. |
| 6,522,122 B2 | 2/2003 | Watanabe et al. |
| 6,529,842 B1 * | 3/2003 | Williams et al. .......... 702/66 |
| 2003/0004664 A1 * | 1/2003 | Ward et al. .............. 702/69 |

OTHER PUBLICATIONS

Seat, S., and Tality, "An Eye-Opening Look at Jitter," [online], pp. 75-76 (Oct. 17, 2002). Retrieved from the Internet: www.edn.com.
"Frequency Agile Jitter Measurement System," Application Note 1267, pp. 1-16, brochure from Agilent Technologies, printed Mar. 22, 2002.

* cited by examiner

*Primary Examiner*—Don N. Vo

(57) ABSTRACT

An apparatus and method for measuring jitter using phase and amplitude undersampling. A sampling circuit samples an input signal to obtain amplitude and phase information, a computation circuit determines Time Interval Error (TIE) information from the amplitude and phase information, and a signal processor processes the TIE information to generate a jitter spectrum.

27 Claims, 16 Drawing Sheets

METHOD AND APPARATUS FOR JITTER MEASUREMENT USING PHASE AND AMPLITUDE UNDERSAMPLING

RELATED APPLICATIONS

This application claims the benefit of U.S. Provisional Application No. 60/461,933, filed Apr. 10, 2003 and U.S. Provisional Application No. 60/477,520, filed Jun. 11, 2003. The entire teachings of the above applications are incorporated herein by reference.

BACKGROUND

Jitter has been defined as the short-term non-cumulative variations of the significant instants of a clock or data signal from their ideal positions in time. The significant instants can be the rising or falling edge of a pulse. Jitter has a variety of sources including imperfections in oscillators, thermal noise, instabilities in the oscillator electronics, RF interference and the transmission of signals through communications equipment such as regenerative repeaters. Large amounts of jitter can cause equipment to fail; hence, designers must look to jitter measurement techniques and devices to properly address the effects of jitter.

Two basic methods may be employed to measure jitter and its effects on equipment: the oscilloscope method and the phase detector method. According to the oscilloscope method a first clock source provides a jitter-free trigger signal for an oscilloscope and the first clock's frequency reference is locked to a second clock source. The second clock source is modulated by jitter and input to a pattern generator which provides jittered data to equipment being tested. The input and output waveforms to the equipment may then be analyzed with oscilloscope functions. Also, the oscilloscope may be used to view eye patterns of signals. The oscilloscope method, however, is limited to jitter having amplitudes less than one unit interval (one unit period).

According to the phase detector method, the phase of the recovered clock, output from the equipment receiving a data signal having jitter, is compared with the phase of the jitter-free clock source. The resulting phase difference is the jitter amplitude measured in unit intervals. A frequency divider placed between the recovered clock signal and the phase detector extends the range of phase detector beyond the unit interval.

Accurately measuring jitter has become increasingly important in testing communications components that operate at high bit rates. As bit rates increase with developing fiber optic technology, jitter increases causing communication components to malfunction. Thus, accurate jitter measurements are necessary for designers to account for jitter. However, measuring the jitter of a high bit rate signal requires the use of costly sampling hardware (e.g., gallium arsenide semiconductor technology).

SUMMARY

Phase and amplitude under-sampling may be employed to measure jitter and avoid the use of costly sampling hardware required for high bit rate signals. In an embodiment, according to the present approach, a jitter measurement device includes a sampling circuit, a computation circuit, and a signal processor. The sampling circuit samples an input signal and provides amplitude and phase information to the computation circuit which uses the information to compute Time Interval Error (TIE) information. The signal processor processes the TIE information to produce a jitter spectrum.

In one aspect, a signal characteristics circuit extracts characteristics from the input signal prior to jitter measurements for use by the computation circuit in computing TIE information. An embodiment of the signal characteristics circuit includes: a wideband clock recovery block that extracts a synchronous clock from the input signal, a narrowband programmable Phase Lock Loop (PLL) that generates a sample clock from the synchronous clock, a sampler that samples the input signal using the sample clock, an Analog to Digital (A/D) converter that converts the input signal samples to digital data, and a Digital Signal Processor (DSP) that determines signal characteristics from the digital data.

The narrowband programmable PLL includes a reference divider that receives a recovered clock signal from the wideband clock recovery block, a Voltage Controlled Oscillator (VCO), a feedback divider that receives the output from the VCO, a phase detector that receives the outputs from the reference and feedback dividers, and a filter that connects the output from the phase detector to the input of the VCO.

The DSP of the signal characteristics circuit is operable to determine high and low values from the digital data to provide high and low threshold values. The DSP further groups the digital data based on whether the digital data is associated with rising or falling edges of the input signal, averages the digital data in both groups that falls within the high and low threshold values, and stores the result in appropriate look up tables corresponding to the rising or falling edge groups.

In an embodiment, the sampling circuit includes a Track and Hold (T/H) sampler that samples the input signal according to the sample clock delayed by a fixed delay. An A/D converter converts the amplitude samples into quantized amplitude values. In addition, one flip-flop receives the sample clock delayed by an adjustable delay and a fixed one unit delay and another flip-flop receives the sample clock delayed by an adjustable delay. In this way the pair of flip-flops sample the input signal to obtain digital sample values positioned in time both before and after the amplitude sample. The adjustable delay may further be adjusted such that the digital samples occur one half of a unit interval before and after the amplitude sample. Relocating the adjustable delay to a position between the sample clock and the T/H sampler can achieve the same result. These digital sample values describe the phase corresponding to the amplitude sample. The flip-flops may also be thermally coupled with a heat sink to maintain their timing requirements over a wide temperature range.

Another embodiment obtains the phase and amplitude information using two T/H samplers, a comparator, and an A/D converter. The T/H samplers sample the input signal according to sample clocks separated by a one half unit interval delay and provide the resulting amplitude samples to a comparator which outputs phase information. A quantized amplitude value is obtained by applying the output from one of the T/H samplers to an A/D converter. In another embodiment the outputs from the T/H samplers may both be applied to separate A/D converters to produce two quantized amplitude values. The DSP can compute phase information from the two quantized amplitude values without the need of a comparator.

The computation circuit uses the quantized amplitude value as an address to obtain a current measured index from the lookup table corresponding to the phase information.

The computation circuit further computes a current ideal index by adding a previous ideal index to the fractional part of the decimal number obtained by multiplying a ratio of the input signal frequency to the sampling clock frequency by the sample order of the input signal data registered in an internal counter. Unique samples of the input signal may be acquired by ensuring that the inverse of the ratio of the input signal frequency to the sampling clock frequency is a prime fraction. The computation circuit finds the difference between the current measured index and the current ideal index. The result is TIE information which may be analyzed by the signal processor to determine peak-to-peak jitter or a ratio of random to deterministic jitter.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

A description of preferred embodiments of the invention follows.

Figure 1:
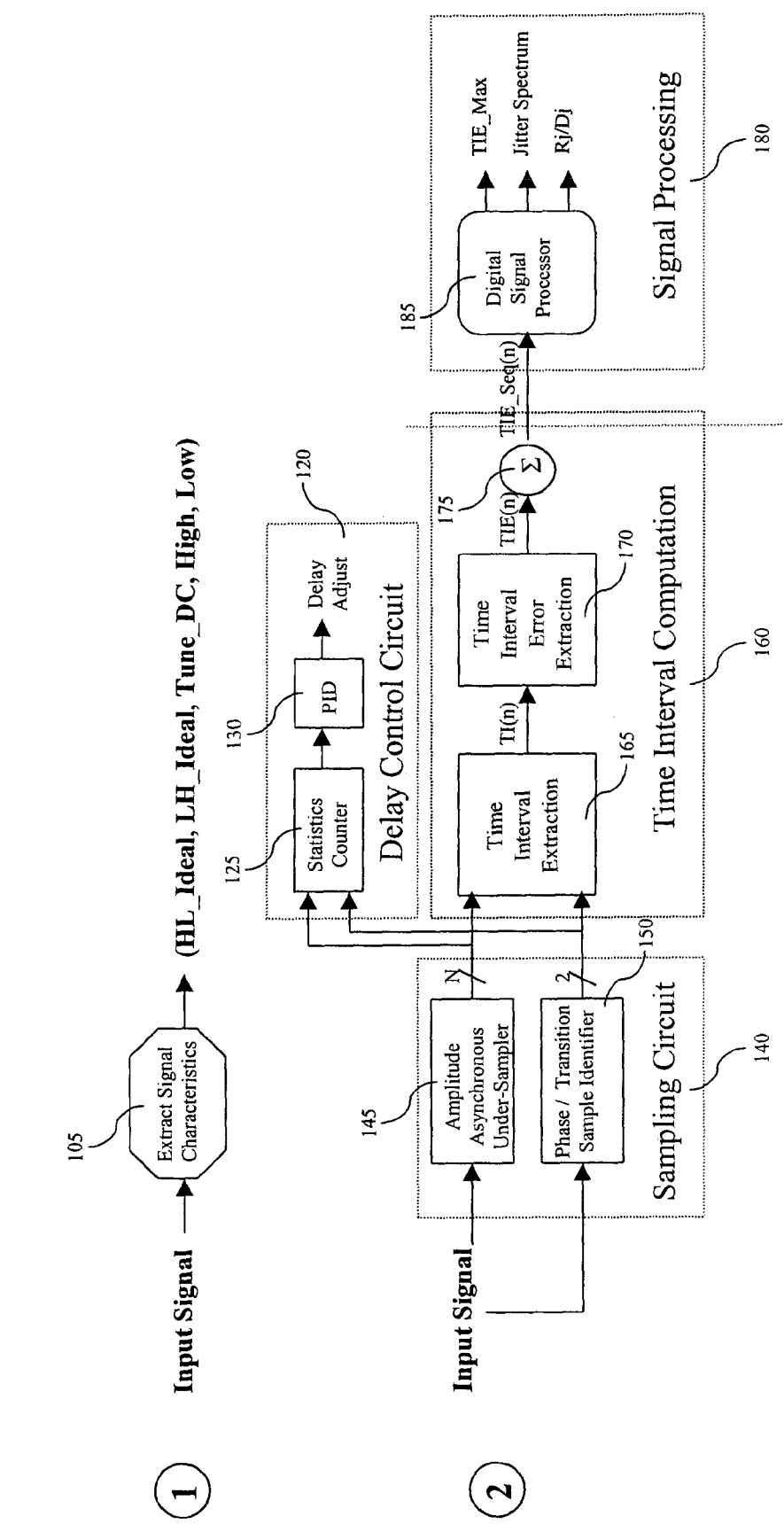
FIG. 1 shows a block diagram of a general embodiment of the present invention.

FIG. 1 shows a block diagram of a jitter measurement circuit in accordance with the principles of the present invention. The jitter measurement circuit includes a block to extract signal characteristics 105, a sampling circuit 140, a delay control circuit 120 consisting of a statistics counter 125 and a Proportional-Integral-Derivative (PID) controller 130, a time interval computation block 160, and a signal processing block 180.

Before taking jitter measurements, the extract signal characteristics block 105 samples an input signal using the coherent undersampling technique and averages the result to obtain "ideal" rising and falling edge waveforms. To begin jitter measurements an amplitude asynchronous under-sampler 145 and a phase/transition sampled identifier 150 receive the input signal and output amplitude and phase information corresponding to the input signal. The statistics counter 125 processes the amplitude and phase information to determine how much the delay on the sample clock driving the amplitude asynchronous under-sampler should be adjusted such that the amplitude is sampled within thresholds of a rising or falling edge of the input signal. The statistics counter provides processed phase and amplitude information to the PID controller 130 which adjusts the delay appropriately.

A time interval extraction block 165 receives the amplitude and phase information and computes a time interval. The time interval error extraction block 170 receives the time interval information and computes a time interval error (TIE) which is accumulated, using an accumulator 175, to produce TIE sequence information. TIE is defined as the phase difference between the signal being measured and the sample or reference clock. A digital signal processor (DSP) 185 processes the TIE sequence information and provides various characteristics of the measured jitter including a maximum TIE (TIE_Max), a jitter spectrum, or a ratio of random to deterministic jitter (Rj/Dj). Maximum TIE is defined as the largest peak-to-peak TIE in any observation interval An embodiment of the signal characteristics extraction block 105 is shown in more detail in FIG. 2. The signal characteristics extraction block 105 includes a wideband clock recovery block 210, a programmable Narrowband Phase Lock Loop (NPLL) 220, a sampler 230, an Analog to Digital (A/D) converter 240, and a Digital Signal Processor (DSP) 250. These blocks form an embodiment of a coherent under-sampling circuit.

According to coherent undersampling as it applies to the present invention, a clock signal is derived from the input signal, frequency divided, and applied to the sampler 230 which samples the input signal at a rate less than the Nyquist rate (two times the highest frequency of the signal). Usually, undersampling causes aliasing such that the samples incorrectly represent the sampled signal. In the present invention, however, since the sample clock is synchronized with the input signal so that unique samples of the input signal are obtained, the input signal characteristics may be correctly reconstructed. Coherent undersampling has the advantage of requiring less expensive sampling hardware operating at lower sampling frequencies.

The wideband clock recovery block 210 extracts a synchronous clock from the incoming input signal. The wideband clock recovery can be implemented using an off the shelf device such as a Broadcom BCM8129 or other similar commercial device.

Figure 3:
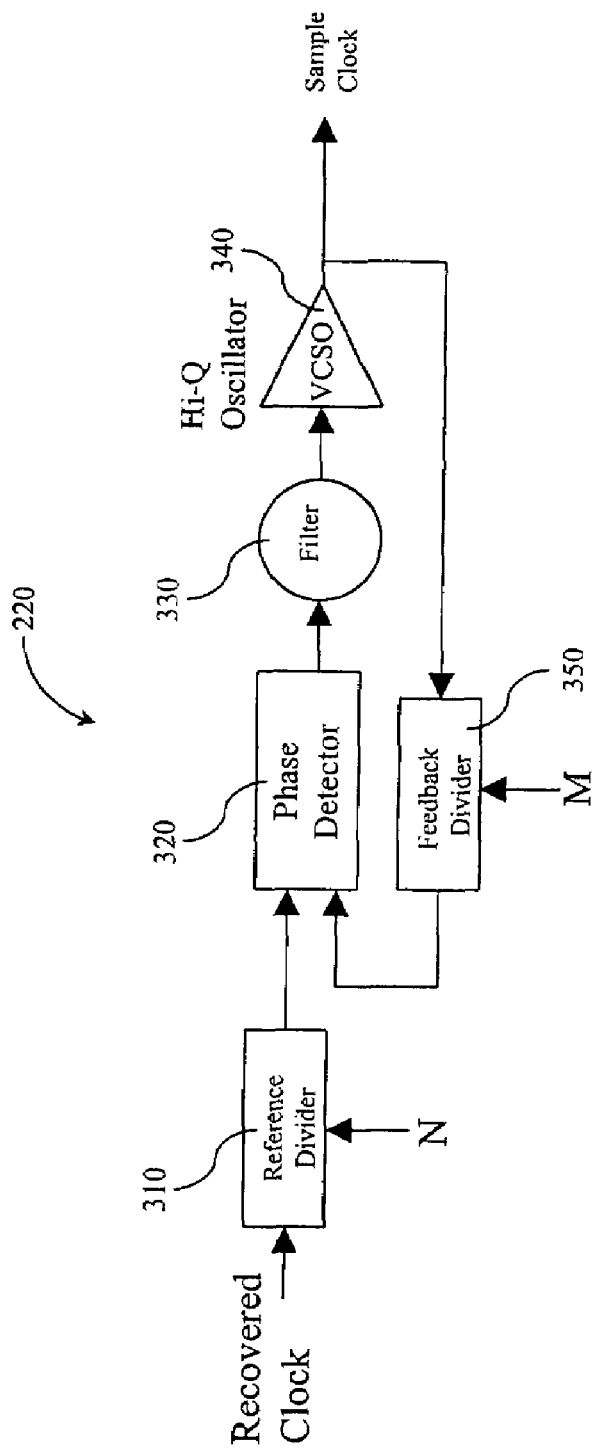
FIG. 3 shows a block diagram for the NPLL of FIG. 2.

The programmable NPLL 220 is shown in more detail in FIG. 3 and includes a reference divider 310, a charge pump phase detector 320, a filter 330, a hi-Q Voltage Controlled SAW (Surface Acoustic Wave) Oscillator (VCSO) 340, and a feedback divider 350. The filter 330 can be a low pass filter or a band pass filter. The programmable NPLL cleans up phase noise and jitter that are characteristics of the recovered clock and generates a sample clock. The sample clock has a frequency relationship to the recovered clock given by the following equation:

Sample Clock=Recovered Clock*$M/N$ where M and N are input values for the feedback and reference dividers associated with the sampling clock and the recovered clock, respectively. The ratio of M/N is preferably a prime fractional number. The prime fractional ratio ensures unique samples over one cycle of the incoming signal.

Figure 2:
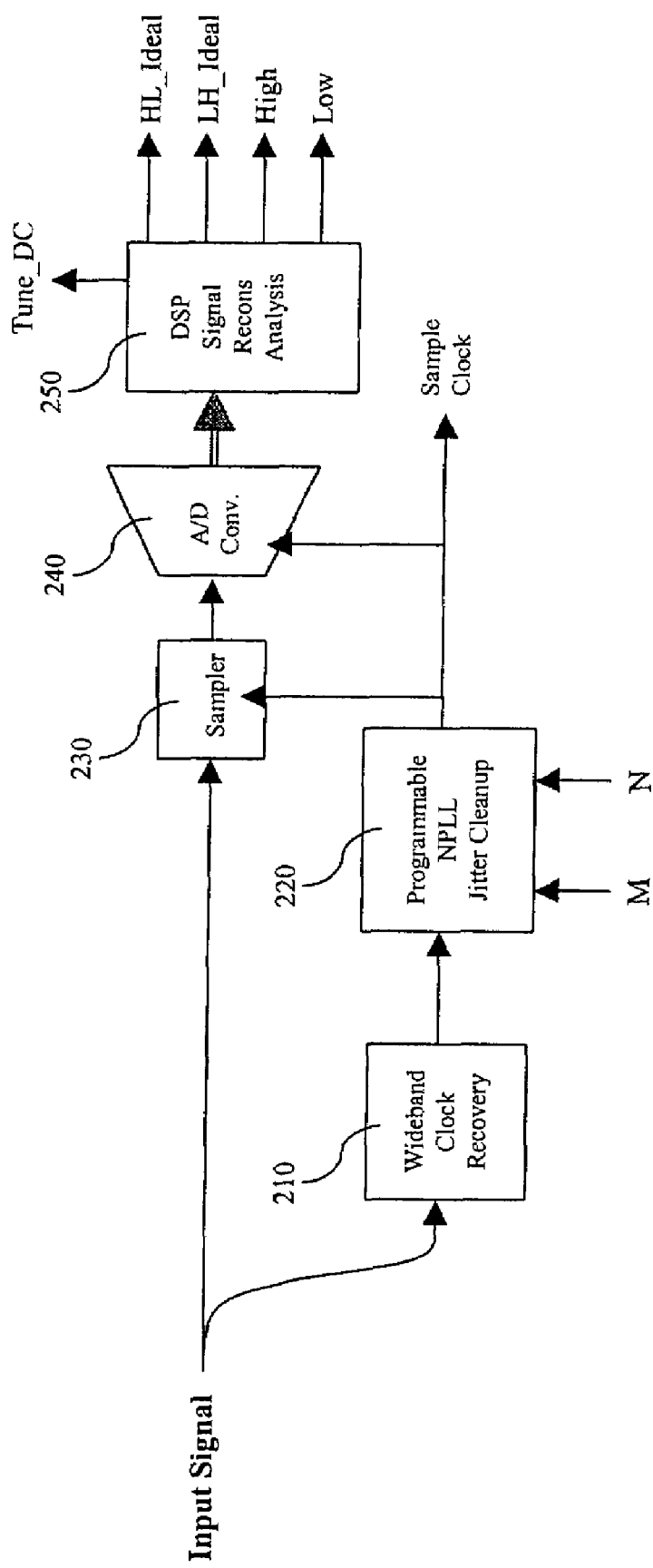
FIG. 2 shows a circuit block diagram of an embodiment of the extract signal characteristics block in FIG. 1 that includes a narrowband phase lock loop (NPLL).

The embodiment of FIG. 2 may have certain limitations with respect to the resolution of the frequency, due to the limits of the M and N values to a practical number. Large M and N values result in a very low intermediate frequency of the phase detector, which may cause instability in the locking process of the PLL, and can also be limited in terms of the supported bit rates.

Referring again to FIG. 2, the sampler 230 takes a snap shot of the input signal upon receiving a clock signal, namely the "Sample Clock." The sampler can be realized using an off the shelf device such as the Rockwell Scientific RTH-020.

The A/D converter 240 converts the sampled analog value of the incoming signal to a digital value that is interpreted by the DSP. The A/D converter 240 can be realized with numerous off the shelf commercial devices, such as an Analog Devices AD9430.

Figure 4:
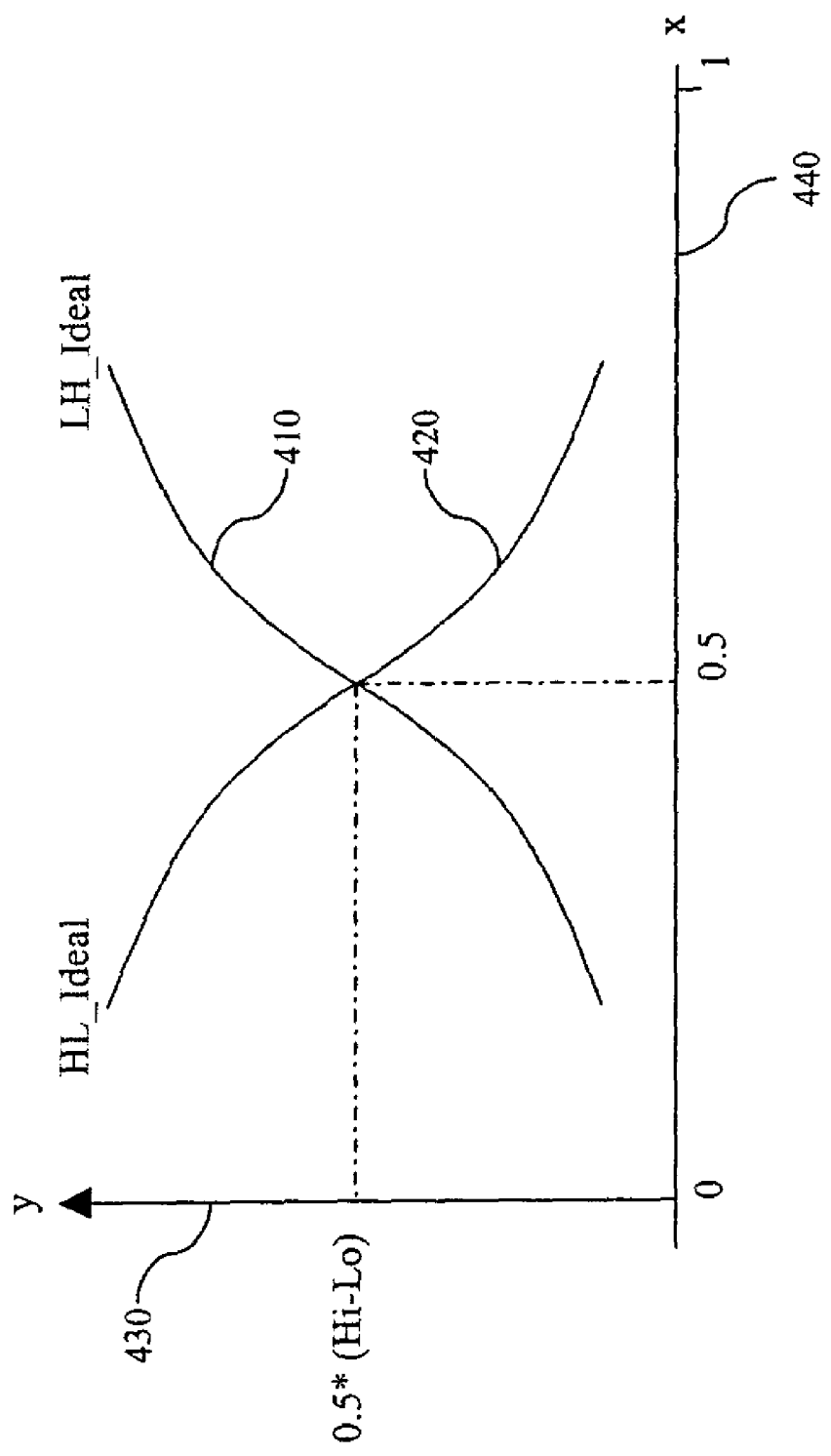
FIG. 4 illustrates a diagram showing the ideal rising and falling edge signal characteristics.
Figure 15:
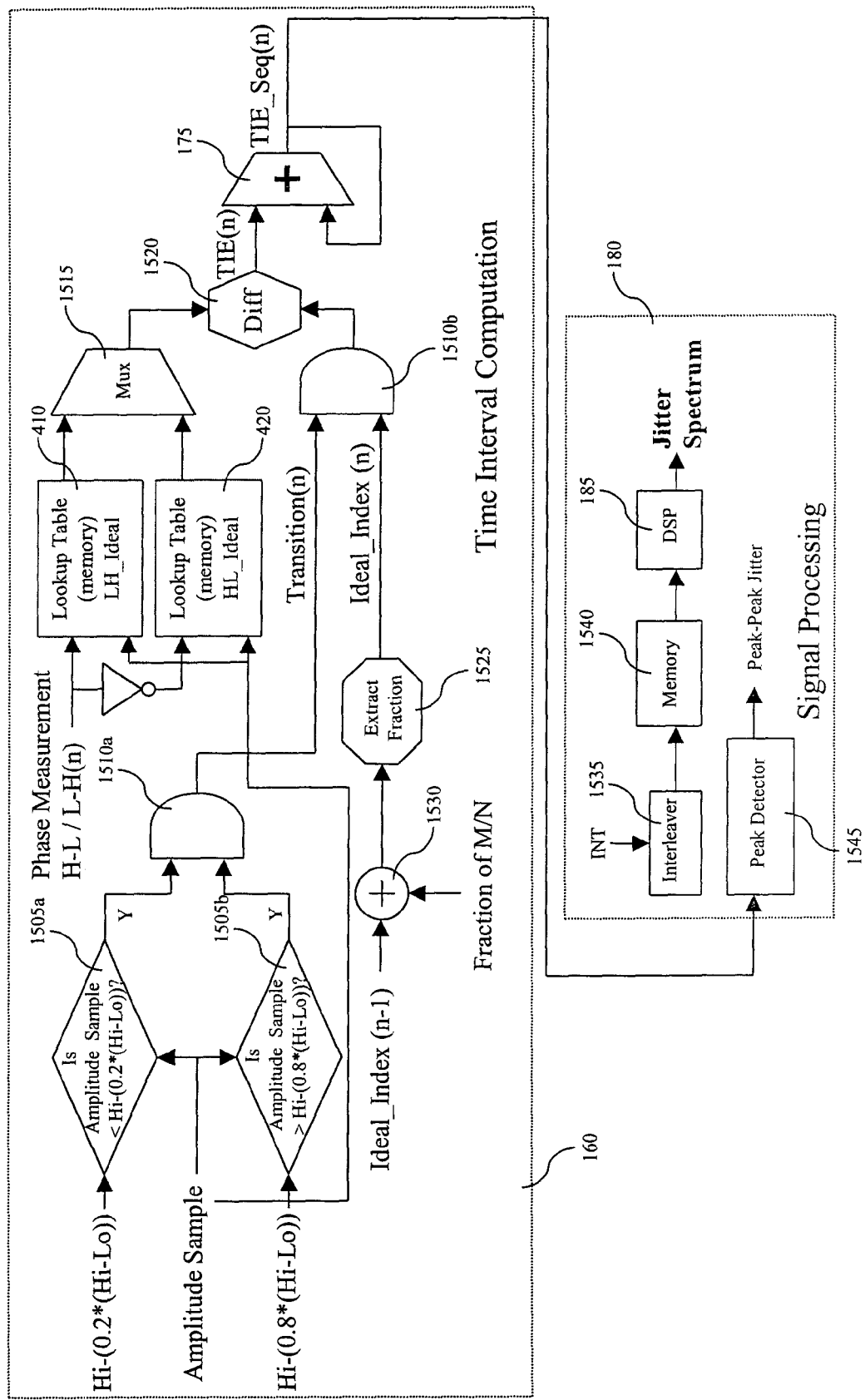
FIG. 15 shows a block diagram of the Time Interval Computation and Signal Processing blocks shown in FIG. 1.

The DSP 250 implements an algorithm that constructs ideal rising and falling edge signal characteristics, LH_Ideal 410 and HL_Ideal 420, shown in FIG. 4, from the various snapshots taken of the incoming signal. The algorithm assigns (x,y) coordinates for each sample, wherein x 440 represents the time domain axis within a unit interval and y 430 represents the signal amplitude. Samples that are within preset high and low thresholds are accumulated over time and grouped according to rising and falling edges. The algorithm averages each group's data over the unit interval and stores the result in memory or look up tables as shown in FIG. 15. The algorithm further determines from the samples average high and low values, High and Low, and stores the values in local memory for comparison with captured data in Time Interval Error (TIE) measurements described further herein. Lastly, the algorithm produces a signal, Tune_DC, to tune the delay control circuit 120 shown in FIG. 1.

Figure 5:
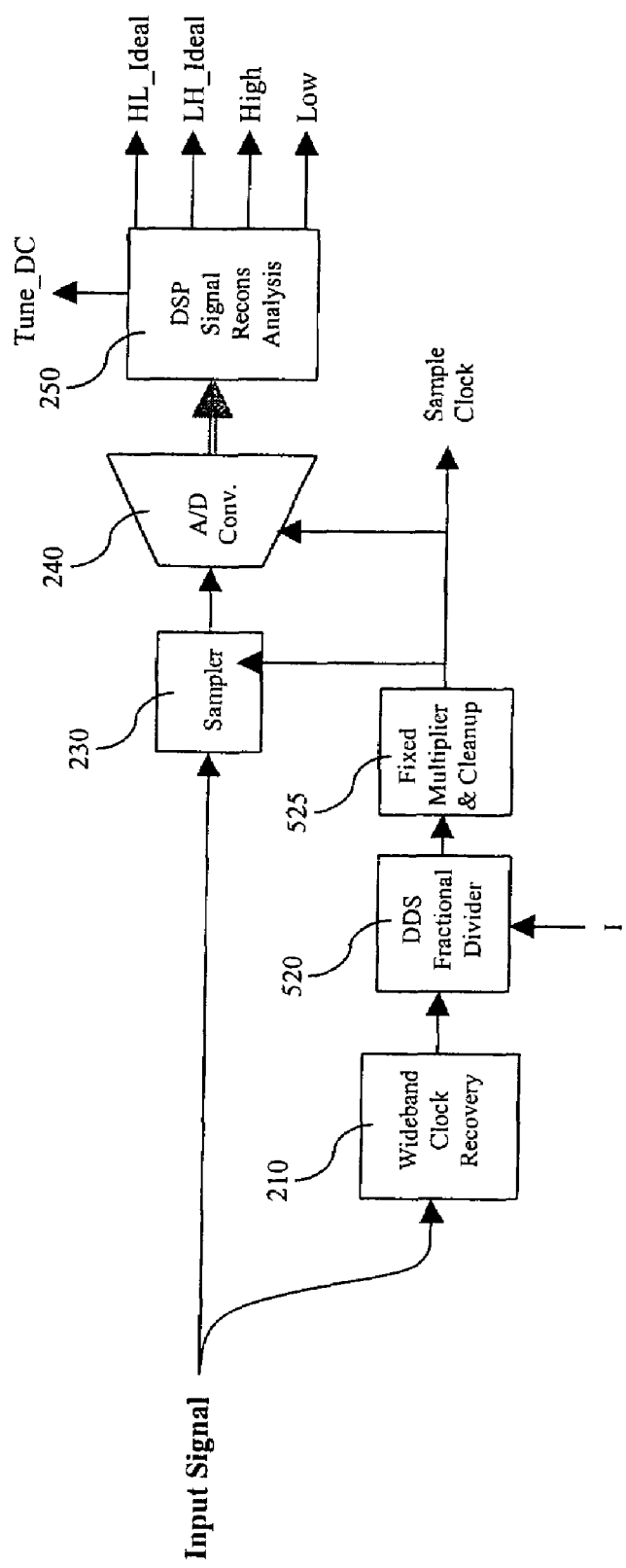
FIG. 5 shows a circuit block diagram of another embodiment of the extract signal characteristics block in FIG. 1 that includes a programmable Direct Digital Synthesizer.

FIG. 5 shows a circuit block diagram of another embodiment of the extract signal characteristics block 105 that includes a programmable Direct Digital Synthesizer (DDS) 520 for providing coherent under-sampling. In addition to the wideband clock recovery block 210, sampler 230, A/D converter 240, and DSP 250 already described, the embodiment of FIG. 5 includes a Fixed Multiplier & Cleanup PLL 525 and a DDS Fractional Divider 520.

The Fixed Multiplier & Cleanup PLL 525 is a particular implementation of the programmable NPLL 220 described above, with specific features that include narrower loop bandwidth, fixed values for reference and feedback dividers, and higher Q. These PLL characteristics result in lower phase noise and lower intrinsic jitter generation, critical for reducing jitter uncertainties for eye measurements. This embodiment requires that a fixed input frequency be used. This is accomplished by the DDS 520.

Figure 6:
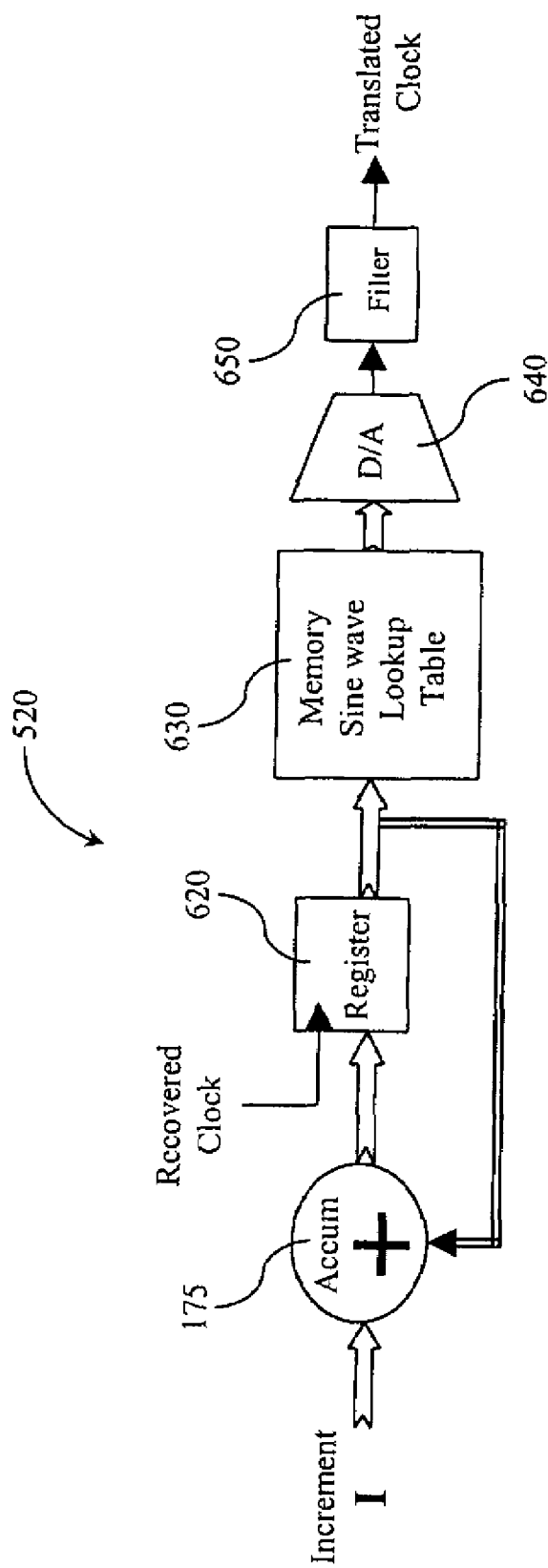
FIG. 6 shows a block diagram of the DDS of FIG. 5.

The Direct Digital Synthesizer (DDS) 520 is used as a fractional divider or fractional phase accumulator that generates a fractional prime sub-multiple of the recovered clock. The DDS 520 translates the wideband recovered clock from any bit rate to a fixed clock feeding the PLL 525. A block diagram of the DDS 520 is shown in FIG. 6 and includes an accumulator 175, a register 620, a memory 630, a Digital to Analog (D/A) converter 640, and a filter 650. The filter 650 can be a low pass filter or a high pass filter.

The Increment (I) in the DDS block diagram is summed with the previous accumulated value at intervals set by the recovered clock. The upper bits of the output of the register 620 drive the address of a lookup memory table that contains a sine wave signal. The memory 630 output is converted to an analog output using the D/A converter 640, and then filtered from harmonics with the low pass filter 650. The value of the Increment is selected to give an absolute and accurate fixed value for the translated clock. This function makes the under-sampling bit rate agnostic. That is, it can support any bit rate, not just SONET (Synchronous Optical Network), FEC (Forward Error Correction), or 10GE (10 Gigabit Ethernet) rates.

The DDS 520 functions as a fractional divider. The PLL 525 multiplies the translated clock by a prime fraction, as shown in the following example for 10G rates:

| Recovered Input Clock | DDS Divider Ratio | Recovered Clock to Sample Clock Ratio |
| --- | --- | --- |
| 9.95328 GHz | 494.16531 | 62.21125 MHz |
| 10.3125 Gbps | 512.00004 | 64.453125 MHz |
| 10.6642 Gbps | 529.46141 | 66.65125 MHz |
| 10.709 Gbps | 531.68567 | 66.93125 MHz |

Figure 7:
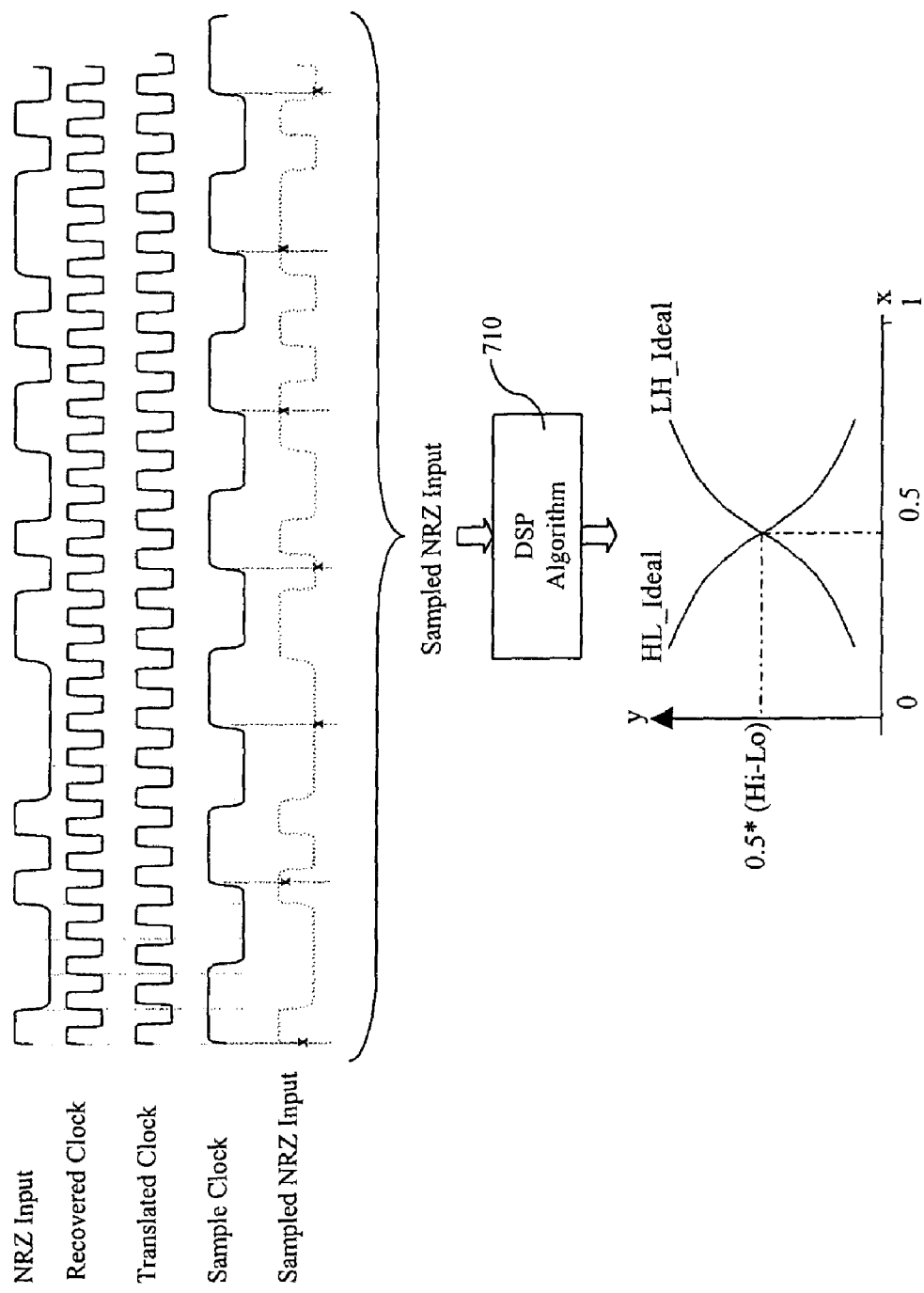
FIG. 7 illustrates a timing diagram and DSP algorithm for the coherent under-sampling circuit used in FIG. 1 to extract signal characteristics.

The DDS embodiment generates a sample clock that has a fixed frequency relationship to the time base of the incoming signal. This relationship is illustrated in the timing diagram of FIG. 7.

In relation to a DSP algorithm 710, a counter tracks the order of the samples. The DSP assigns a time domain index for every sample in the memory based on the fractional portion of the following equation:

Index=Fraction($SO*SR$)

Index=the time domain fraction of the Unit Interval (UI) of a single cycle of input data SO=the Sample Order from the data registered with the internal counter SR=the Sample Ratio of frequency of the input signal to the frequency of the Sample Clock Fraction=the fractional value that results from subtracting round down of (SO*SR) from (SO*SR)

Example:

Recovered Input Clock: 9.95328 GHz

Sample Clock: 160 MHz

Recovered Clock to Sample Clock Ratio: 62.21125

Consecutive samples of the input signal will have the following index and thus corresponding time domain coordinate:

| Sample Order | SO * SR | Index or fraction of Unit Interval (UI) |
|---|---|---|
| 1 | 62.21125 | 0.21125 |
| 2 | 124.4225 | 0.4225 |
| 3 | 186.63375 | 0.63375 |
| 4 | 248.845 | 0.845 |
| 5 | 311.05625 | 0.05625 |
| 6 | 373.2675 | 0.2675 |

As a large number of samples is accumulated, distinct values along the x-axis or time domain axis are collected and used to display and analyze the data.

Figures 8A, 8B:
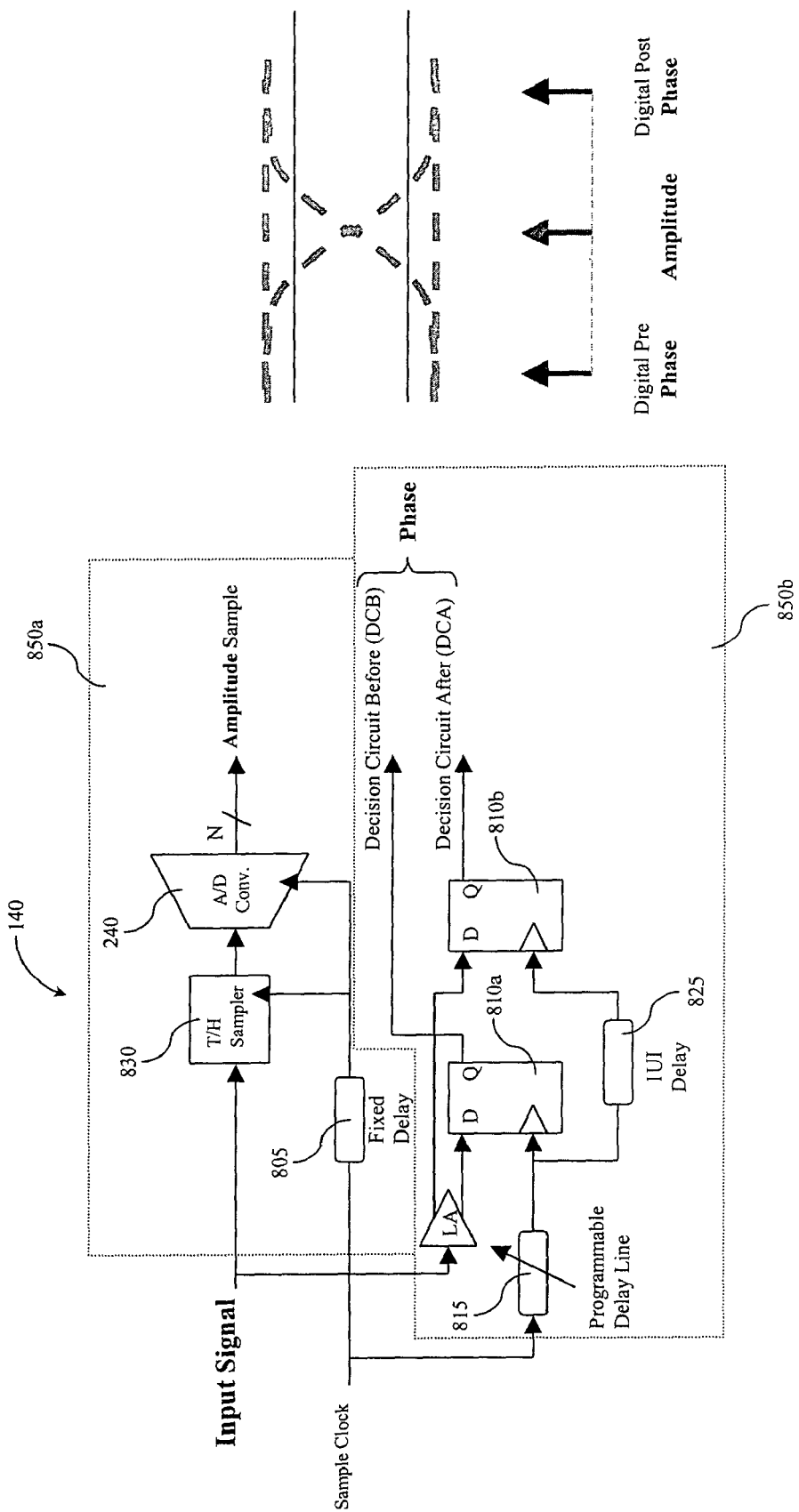
FIG. 8A shows a block diagram of an embodiment of the sampling circuit shown in FIG. 1.
FIG. 8B illustrates possible positions of the sampling instants with respect to the input signal.

FIG. 8A shows a block diagram of an embodiment of the sampling circuit 140 shown in FIG. 1. In the amplitude portion 850a of the embodiment, a Track and Hold (T/H) sampler 830 receives and samples the input signal and an Analog to Digital (A/D) converter 240 digitizes the output from the T/H Sampler 830. The T/H Sampler 830 and the A/D converter 240 are clocked by a sample clock derived from coherent under-sampling delayed by a fixed delay 805, e.g., 0.5 to 0.75 UI. Sample values above the preset high threshold or below the preset low threshold are not considered for extracting Time Interval information. All other sample values are considered to have occurred during a transition from Low to High or from High to Low and are used for extracting Time Interval information.

In the phase portion 850b of the embodiment shown in FIG. 8A, two flip-flops receive the input signal and produce the digital values Decision Circuit Before (DCB) and Decision Circuit After (DCA) indicative of phase information. A first flip-flop 810a outputs the DCB value and receives the sample clock derived from coherent under-sampling delayed by a programmable delay 815 which is adjusted by the delay control circuit 120 shown in FIG. 1. The programmable delay 815 is adjusted such that the output value DCB occurs 0.5 unit intervals before the digitized sample output from the amplitude portion 850a of the embodiment in FIG. 8A. A second flip-flop 810b outputs the DCA value and receives the same sample clock as the first flip-flop 810a, but delayed by a fixed one unit interval delay 825. Thus, the output DCA value occurs 0.5 unit intervals after the digitized sample output from the amplitude portion 850a of the embodiment in FIG. 8A. The decision circuit values are then used to determine the phase of the transition according to the following logic: If DCB=1 & DCA=0, then High to Low transition; if DCB=0 & DCA=1, then Low to High transition.

FIG. 8B illustrates possible positions of the sampling instants with respect to the input signal. The phase samples are latched in nominally a half unit interval before and after the amplitude sample as shown in FIG. 8B. The solid horizontal lines represent the preset high and low threshold values within which the amplitude sample must occur to be considered for jitter measurements.

Figure 9:
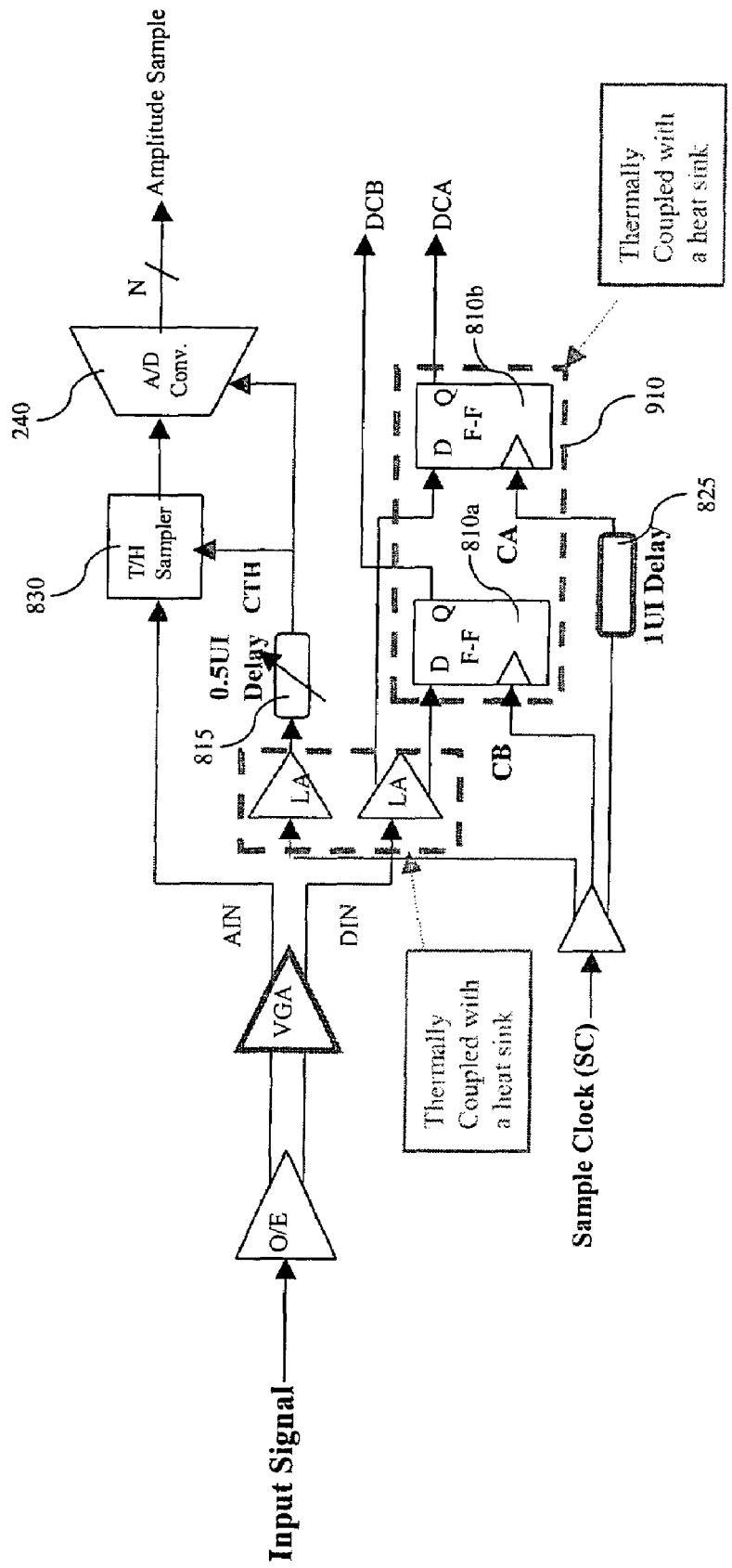
FIG. 9 shows a block diagram of an athermal embodiment of the sampling circuit shown in FIG. 1.

FIG. 9 is a block diagram of an athermal embodiment of the sampling circuit 140 shown in FIG. 8A. An Optical to Electrical (O/E) converter 920 in series with a Variable Gain Amplifier (VGA) 925 receive the input signal and provide the electrical signals AIN and DIN to the amplitude and phase portions of the sampling circuit. Unlike the embodiment in FIG. 8A, the first flip-flop 810a and the second flip-flop 810b, together forming the flip-flops 810, are thermally coupled with a heat sink 910 to maintain their timing requirements over a wide temperature range. Moreover, the programmable delay 815 coupled to the flip-flops 810 is placed on the line between the sample clock and the T/H sampler 830 and A/D converter 240. The delay control circuit 120 adjusts the delay nominally to 0.5 unit intervals such that the amplitude sample maintains a position 0.5 unit intervals from DCB and DCA. Path length matching of the lines leading from the sample clock to the T/H sampler 830 and the flip-flops 810 applies to maintain the relative phase positions of the amplitude and phase samples.

Figure 10:
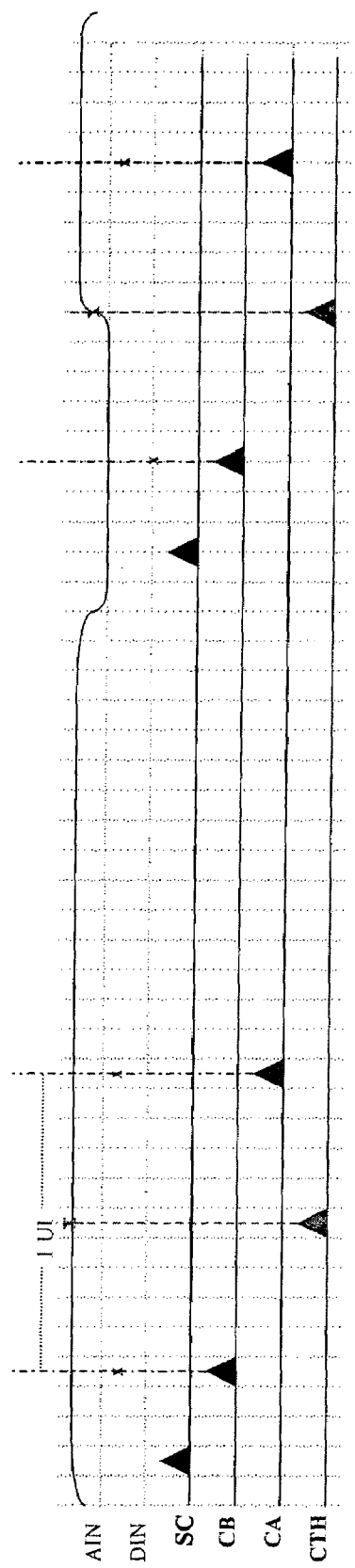
FIG. 10 shows a timing diagram of the sampling circuit shown in FIG. 9.

FIG. 10 shows a timing diagram illustrating the functions performed by the sampling circuit 140 shown in FIG. 9. AIN is the input signal received by the T/H sampler 830. DIN is the input signal value latched by the flip-flops 810 according to the delayed sample clocks, CA and CB, corresponding to the decision circuit values DCA and DCB, respectively. SC is the Sample Clock and CTH is the sample clock received by the T/H sampler 830. The DIN values obtained at CB and CA correspond to the decision circuit values DCB and DCA, respectively. In the first set of samples shown in FIG. 10, DCB=1 and DCA=1, thus there is no transition. In the second set of samples shown in FIG. 4, DCB=0 and DCA=1, thus the transition is from Low to High.

Figure 11:
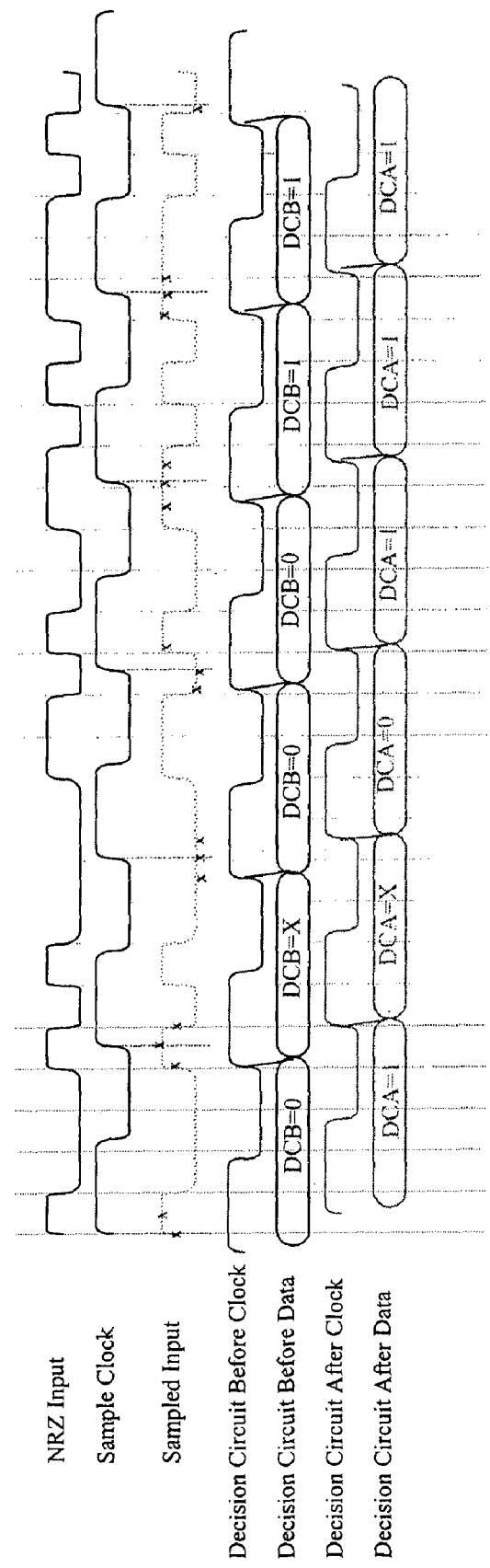
FIG. 11 shows another timing diagram of the sampling circuit shown in FIG. 9.

FIG. 11 shows another timing diagram of the sampling circuit 140 shown in FIG. 9. The decision circuit data bits, DCA and DCB, are phase samples corresponding to the input signal ideally taken half a unit interval before and half a unit interval after the amplitude sample of the input signal is taken as illustrated in FIG. 11. The middle "x"s shown in FIG. 11 represent the amplitude samples and the adjacent "x"s represent the phase samples. The decision circuit data bits, DCA and DCB, are used to determine whether a Low to High transition or a High to Low transition occurs when the amplitude sample is between preset high and low threshold values. For example, in the fourth set of samples of the NRZ Input the first phase sample is Low and thus DCB=0 and the second phase sample is High and thus DCA=1. Therefore, the transition is from Low to High.

Figure 12:
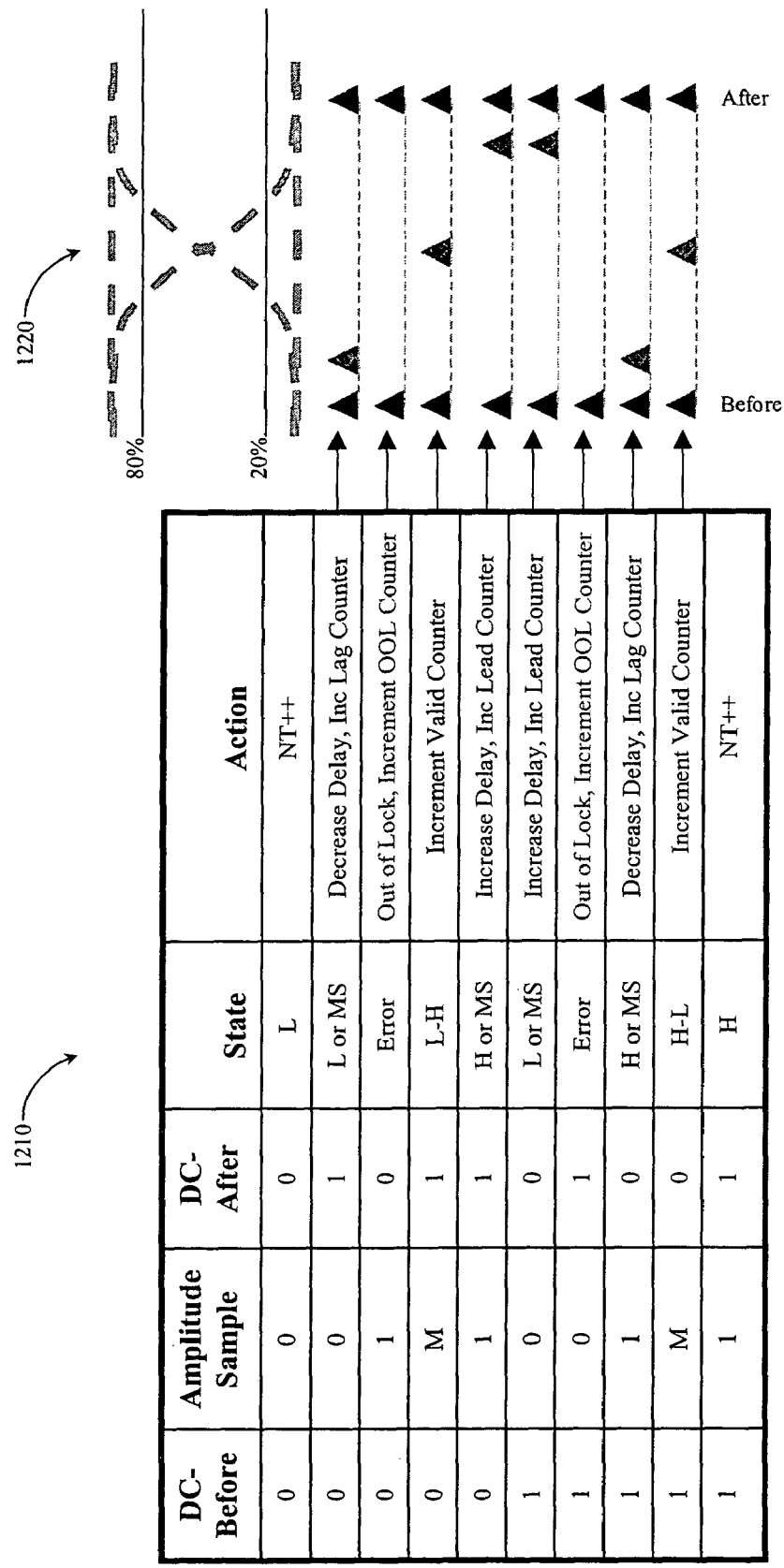
FIG. 12 shows a state table and an illustration of each of the states for the state machine implemented in the statistics counter shown in FIG. 1.

FIG. 12 shows a state table 1210 for the state machine implemented in the statistics counter 125 shown in FIG. 1. The statistics counter 125 includes valid, lead, and lag counters. Depending on the state determined from both the amplitude and phase samples, one or more of the counters is incremented and the programmable delays 815 in FIG. 8 and FIG. 9 are adjusted based on the counts in the valid, lead, and lag counters. The scale of the difference in counts between the counters is proportional to the error shift from ideal phase position. Thus, the ideal phase position occurs when the valid, lead, and lag counters have the same value.

The statistics counter also includes an Out Of Lock (OOL) counter and a No Transition (NT) counter. In either the 001 Low or Metastable (L or MS) state or the 110 High or Metastable (H or MS) state, the lag counter is incremented and the delay is decreased. In either the 100 L or MS state or the 011 H or MS state, the lead counter is incremented and the delay is increased. In either the Low to High transition (L-H) or High to Low transition (H-L) states, the valid counter is incremented. In either the High (H) or Low (L) states, the NT counter is incremented. Finally, in the Error states (010 or 101), the OOL counter is incremented.

A state table diagram 1220, also shown in FIG. 12, illustrates each of the states except for the L and H states. The outer triangles represent the phase sample instants and the triangles between the outer triangles represent the amplitude sample instants.

Figure 13:
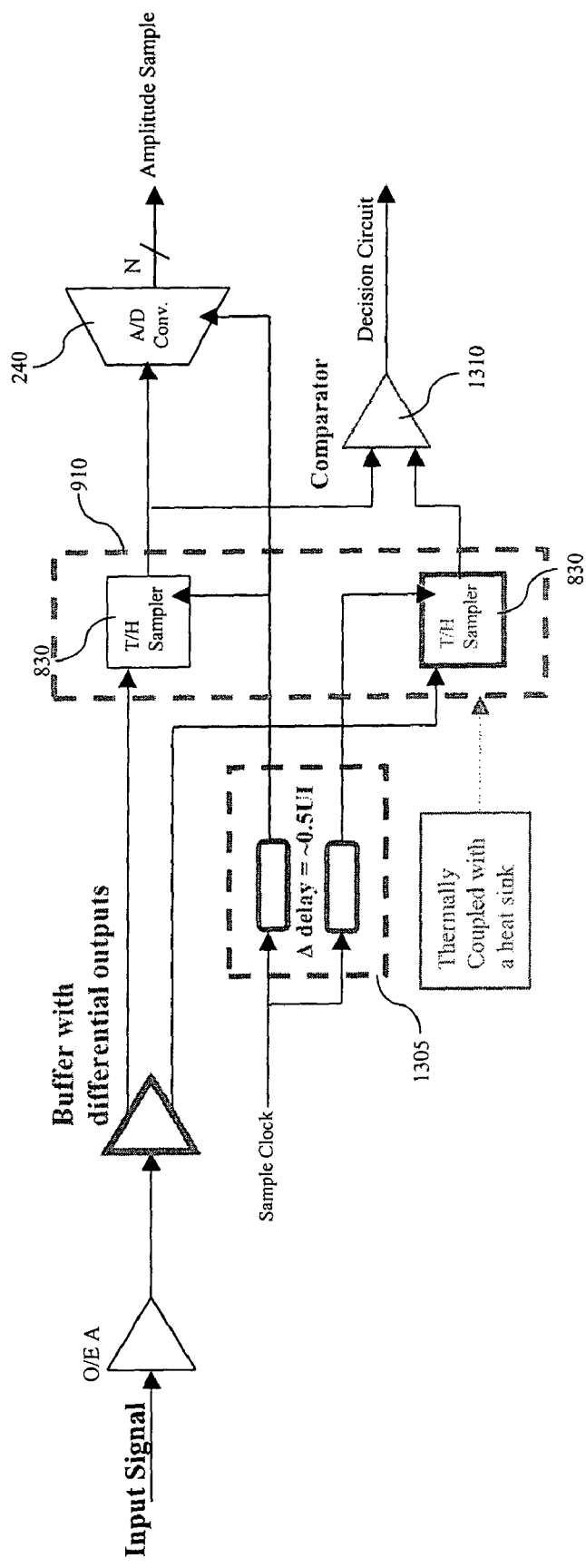
FIG. 13 shows a block diagram of a second athermal embodiment of the sampling circuit shown in FIG. 1.

A second athermal embodiment of the sampling circuit 140 (FIG. 1) is shown in FIG. 13. In this embodiment two T/H samplers 830, thermally coupled with a heat sink 910 to ensure common behavior as a function of temperature, receive the input signal. The T/H samplers 830 receive the sample clock separated by a 0.5 unit interval delay 1305. A comparator 1310 compares the output values from the T/H samplers 830 to determine whether an amplitude sample corresponds to a rising or a falling edge.

Figure 14:
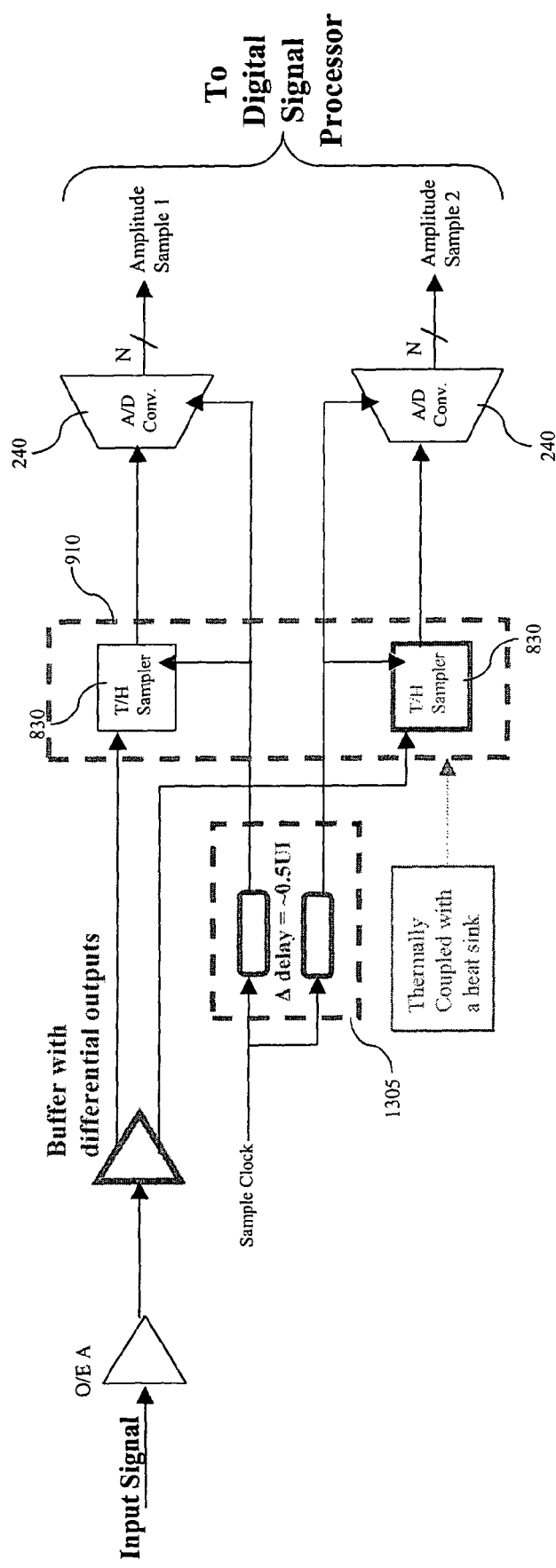
FIG. 14 shows a block diagram of a third athermal embodiment of the sampling circuit shown in FIG. 1.

A third athermal embodiment of the sampling circuit 140 (FIG. 1) is shown in FIG. 14. In this embodiment two T/H samplers 830 receive the input signal and two A/D converters 240 receive the outputs from the T/H samplers 830. The T/H samplers 830 and the A/D converters 240 receive the sample clock separated by a 0.5 unit interval delay 1305. The outputs from the A/D converters 240 are fed to a digital signal processor (not shown) which determines whether the amplitude sample corresponds to a rising or falling edge. Either output may be used as an amplitude for jitter measurements.

FIG. 15 shows a logic block diagram of the Time Interval Computation block 160 and Signal Processing block 180 shown in FIG. 1 which extract and perform signal processing on the Time Interval Error (TIE) and the TIE sequence information. The Time Interval Computation block 160 includes logic block diagrams for the transition identification and ideal index calculations. The transition identification is accomplished by comparing the input amplitude sample against preset thresholds (e.g., Hi−(0.2*(Hi−Lo)) and Hi−(0.8*(Hi−Lo))). If the input amplitude sample value is above the low threshold 1505*a* and below the high threshold 1505*b* (the "and" logic is shown as a first AND gate 1510*a*), then the sample is considered to have occurred at a transition (i.e., transition(n)=1); otherwise, the sample did not occur at a transition (i.e., transition(n)=0). Ideal_Index(n) is the fraction of the unit interval (a single cycle) of the input signal used as an address to extract data from memory for comparison. Ideal_Index(n) is obtained by summing the fractional portion of M/N, or the ratio of the input signal frequency to the sampling clock frequency, with Ideal_Index(n−1) using a summer 1530 and extracting the fractional portion from the resulting decimal number using an extract Fraction function block 1525. The transition(n) and ideal_index(n) values connect to the inputs of a second AND gate 1510*b* so that the ideal_index value does not pass through to the differentiator 1520 unless the amplitude sample occurs on a transition.

The sampled signal data values provide an address to an N×N look up table for LH_Ideal 410 or an N×N look up table for HL_Ideal 420 containing the ideal rising and falling signal characteristics, where N is the square of the number of bits of the A/D converter 240. A channel selector coupled to a Mux 1515 selects either the H-L or the L-H data to be differentiated. The differentiator 1520 computes the difference between the measured data from the look up table and the Ideal_Index value. In other words, the differentiator computes the difference in time between the measured phase of the signal and where the signal should be if there were no jitter. The output of the differentiator 1520, TIE(n), is the instantaneous value of the jitter in the time domain from the previous sample. This output is accumulated over time by an accumulator 175 to produce a TIE sequence, TIE_Seq(n), which is the time domain representation of the jitter.

To reduce the memory requirements for wander measurements, an interleaver 1535 skips an integer number of samples (INT) prior to storing the data in memory 1540. Next, the digital signal processor (DSP) 185 computes the spectral domain characteristics of the TIE sequence by means of the Fast Fourier Transform (FFT) or the Discrete Fourier Transform (DFT). Moreover, to obtain the peak to peak jitter, a peak detector 1545 captures the positive and negative maximum values of the TIE sequence.

Figure 16:
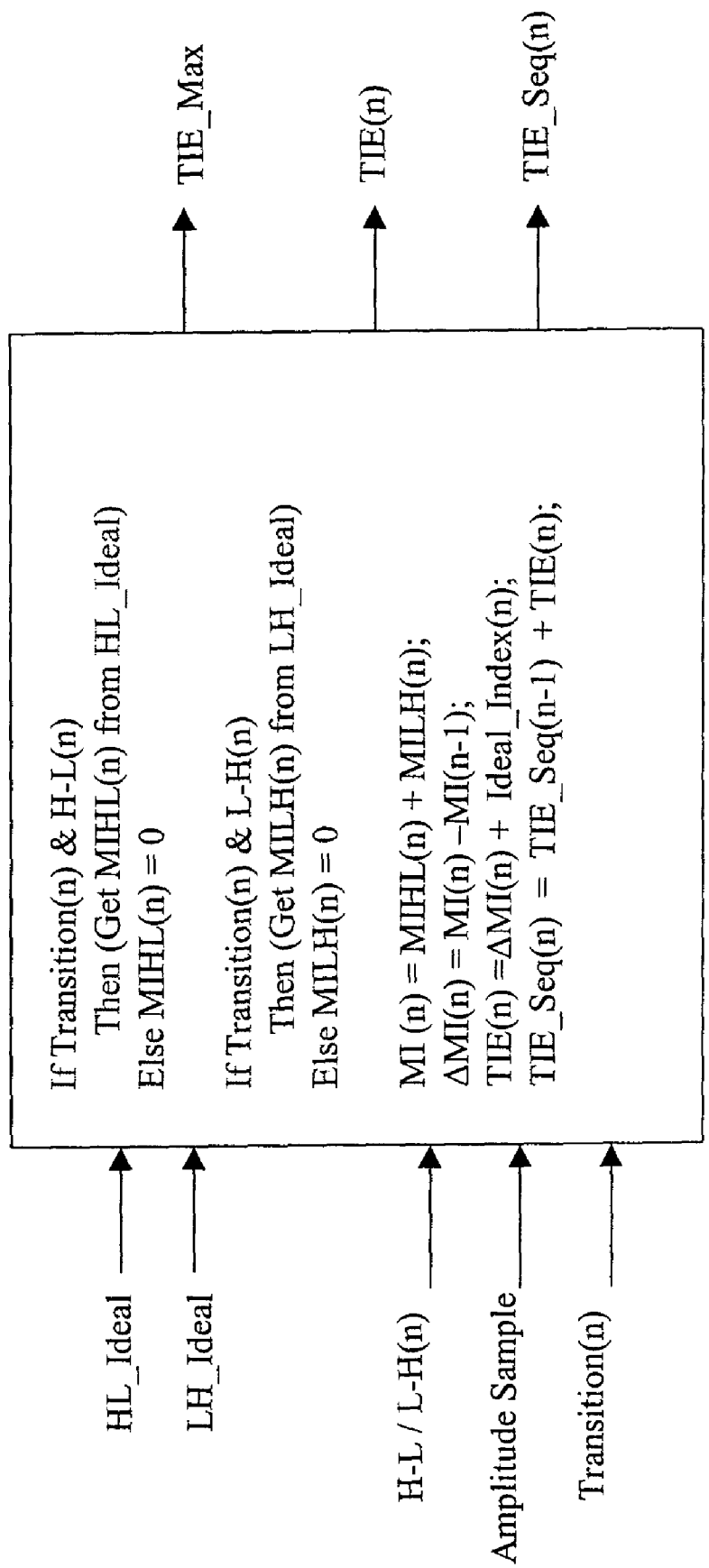
FIG. 16 shows an algorithm corresponding to the Time Interval Computation block diagram shown in FIG. 15.

FIG. 16 shows an algorithm or Boolean logic corresponding to the logic blocks in FIG. 15 which extract the TIE and the TIE sequence.

The invention claimed is:

1. An apparatus for providing jitter measurement comprising:
   a sampling circuit for sampling an input signal to obtain amplitude and phase information;
   a computation circuit for computing Time Interval Error (TIE) information from the amplitude and phase information; and
   a signal processor for determining a jitter spectrum from the TIE information.

2. The apparatus of claim 1 further comprising a signal characteristics circuit for extracting characteristics of the input signal.

3. The apparatus of claim 2 wherein the computation circuit uses the extracted characteristics in computing the TIE information.

4. The apparatus of claim 2 wherein the signal characteristics circuit comprises:
   a wideband clock recovery block for extracting a synchronous clock from the input signal;
   a narrowband programmable Phase Lock Loop (PLL) for generating a sample clock from the synchronous clock;
   a sampler for sampling the input signal using the sample clock to obtain signal samples;
   an Analog to Digital (A/D) converter for converting the input samples to digital data; and
   a Digital Signal Processor (DSP) for determining signal characteristics from the digital data.

5. The apparatus of claim 4 wherein the narrowband programmable PLL comprises:
   a reference divider receiving a recovered clock signal from the wideband clock recovery block;
   a Voltage Controlled Oscillator (VCO);
   a feedback divider receiving the output from the VCO;
   a phase detector receiving the outputs from the reference and feedback dividers; and
   a filter connecting the output from the phase detector to the input to the VCO.

6. The apparatus of claim 5 wherein the VCO is a Hi-Q VCO.

7. The apparatus of claim 5 wherein the VCO is a Voltage Controlled SAW (Surface Acoustic Wave) Oscillator (VCSO).

8. The apparatus of claim 5 wherein the phase detector is a charge pump phase detector.

9. The apparatus of claim 4 wherein the DSP determines high and low values from the digital data to compute high and low threshold values based on the high and low values and preset threshold functions.

10. The apparatus of claim 9 wherein the DSP: (i) groups the digital data based on whether the digital data is associated with rising or falling edges of the input signal, (ii) averages the digital data in both groups that falls within the high and low threshold values, and (iii) stores the result in appropriate look up tables corresponding to the rising or falling edge groups.

11. The apparatus of claim 1 wherein the sampling circuit includes a Track and Hold (T/H) sampler that receives the input signal and the sample clock delayed by a fixed delay and provides amplitude samples to an A/D converter that generates quantized amplitude values corresponding to the amplitude samples.

12. The apparatus of claim 11 wherein the sampling circuit further includes a first flip-flop and a second flip-flop that receive the input signal, the first flip-flop receiving the sample clock delayed by an adjustable delay and the second flip-flop receiving the sample clock delayed by the adjustable delay and a one unit delay, the output from the first flip-flop corresponding to a sampled digital value of the input signal sampled before the quantized amplitude value and the output from the second flip-flop corresponding to a sampled digital value of the input signal sampled after the quantized amplitude value, the digital sample values corresponding to the phase of the input signal.

13. The apparatus of claim 12 wherein the flip-flops are thermally coupled with a heat sink to maintain their timing requirements over a wide temperature range.

14. The apparatus of claim 12 wherein a delay control circuit adjusts the adjustable delay such that the digital values are sampled one half of a unit interval before and after the amplitude value is sampled.

15. The apparatus of claim 12 wherein the T/H sampler and the A/D converter receive the sample clock delayed by the adjustable delay.

16. The apparatus of claim 15 wherein the delay control circuit adjusts the adjustable delay such that the digital values are sampled one half of a unit interval before and after the amplitude value is sampled.

17. The apparatus of claim 1 wherein the sampling circuit includes first and second T/H samplers that receive the input signal, the second T/H sampler receiving a sample clock delayed by one half of a unit interval from the sample clock provided to the first T/H sampler.

18. The apparatus of claim 17 wherein: (i) the outputs from the T/H samplers are input to a comparator, (ii) the comparator outputs a digital value corresponding to the phase of the input signal sample, and (iii) an A/D converter receives the output from the first T/H sampler and generates a quantized amplitude value corresponding to the sampled input signal.

19. The apparatus of claim 17 wherein the sampling circuit includes a first A/D converter that receives the output from the first T/H sampler and a second A/D converter that receives the output from the second T/H sampler, the outputs to the A/D converters corresponding to quantized amplitude values of distinct input signal samples.

20. The apparatus of claim 19 wherein the quantized amplitude values are provided to the DSP which computes the phase corresponding to either quantized amplitude value.

21. The apparatus of claim 1 wherein the signal processor performs further analysis including determining peak-to-peak jitter or a ratio of random to deterministic jitter.

22. The apparatus of claim 18 wherein the computation circuit includes lookup tables providing a measured index based on the quantized amplitude value input to the lookup tables.

23. The apparatus of claim 22 wherein the computation circuit further includes a differentiator finding the difference between the measured index associated with a current quantized amplitude value from a current ideal index.

24. The apparatus of claim 23 wherein the computation circuit computes the current ideal index corresponding to a time domain fraction of the unit interval of a single cycle of the input signal, by adding a previous ideal index to the fractional part of the decimal number obtained by multiplying a ratio of the input signal frequency to the sampling clock frequency by the sample order of the input signal data registered in an internal counter.

25. The apparatus of claim 24 wherein the computation circuit computes the current ideal index using a ratio of the input signal frequency to the sampling clock frequency such that the inverse of the ratio is a prime fraction.

26. A method for measuring jitter comprising:
sampling the input signal to obtain amplitude and phase information corresponding to the input signal;
computing TIE information from the amplitude and phase information corresponding to the input signal;
analyzing the TIE information to determine a jitter spectrum.

27. The method of claim 26 further comprising extracting characteristics from the input signal for use in computing TIE information comprising:
extracting a synchronous clock from the input signal;
generating a sample clock from the synchronous clock;
sampling the input signal upon receiving sample clock signals;
converting the samples to digital data; and
determining signal characteristics from the digital data.

* * * * *